United States Patent [19]

Bodager

[11] Patent Number: 5,565,301
[45] Date of Patent: Oct. 15, 1996

[54] PROCESS FOR FORMING A COLORED IMAGE

[75] Inventor: Gregory A. Bodager, Monroeton, Pa.

[73] Assignee: E. I. Du Pont de Nemours and Company, Wilmington, Del.

[21] Appl. No.: 100,222

[22] Filed: Aug. 2, 1993

[51] Int. Cl.$^6$ .............................. G03C 11/12; G03F 7/30
[52] U.S. Cl. .......................... 430/257; 430/143; 430/160; 430/166; 430/167; 430/260; 430/262; 430/292; 430/293
[58] Field of Search ...................................... 430/258, 257, 430/260, 293, 143, 160, 167, 166, 262, 292

[56] References Cited

U.S. PATENT DOCUMENTS

| | | | |
|---|---|---|---|
| 3,060,023 | 10/1962 | Burg et al. | 96/28 |
| 3,060,024 | 10/1962 | Burg et al. | 96/28 |
| 3,060,025 | 10/1962 | Burg et al. | 96/28 |
| 3,481,736 | 12/1969 | Ruff et al. | 96/28 |
| 3,574,049 | 4/1971 | Sander et al. | 161/220 |
| 3,607,264 | 9/1971 | Westfield et al. | 96/28 |
| 4,766,053 | 8/1988 | Shinozaki et al. | 430/256 |
| 5,059,509 | 10/1991 | Mino et al. | 430/257 |
| 5,075,722 | 12/1991 | Adolphson et al. | 355/77 |
| 5,094,931 | 3/1992 | Platzer | 430/143 |
| 5,109,471 | 4/1992 | Lang | 392/396 |
| 5,192,630 | 3/1993 | Platzer | 430/11 |
| 5,236,542 | 8/1993 | Bailey et al. | 156/583.1 |

*Primary Examiner*—John S. Y. Chu

[57] ABSTRACT

A process for forming a colored image comprising, in order:

(A) imagewise exposing to actinic radiation a photosensitive element comprising a carrier support, a carrier surface, a first adhesive layer and a first photosensitive layer, (B) developing the exposed first photosensitive layer, (C) laminating to the element a transfer element comprising a transfer support, and a transfer surface layer which is adjacent to a colored pattern in the element of step (A) with the proviso that the transfer element does not have an adhesive layer which transfers to the colored pattern, (D) removing said carrier support and said carrier surface, revealing said first adhesive layer, (E) laminating the element the element from step (D) to a permanent support wherein the first adhesive layer is adjacent to the permanent support; and (F) removing said transfer support and said transfer surface layer.

10 Claims, 2 Drawing Sheets

PROCESS FOR FORMING A COLORED IMAGE

FIELD OF THE INVENTION

This invention relates to the formation of colored images. More particularly, this invention relates to the formation of a colored image followed by transfer to support.

BACKGROUND OF THE INVENTION

Photosensitive elements for image-reproduction are well-known in the graphics arts industry. Such elements are usually exposed to radiation through an image-bearing transparency, such as a color separation transparency, to produce an image that is either a positive or negative of the transparency.

Such photosensitive elements are widely used in off-press color proofing to simulate the images produced by printing. In a surprint proof, for example, all of the colored images are superposed, by multiple exposure, lamination, or transfer, on a single support. The colored images cannot be separated and viewed individually.

Many of the commonly used photosensitive elements used in image reproduction require development by organic solvents or an aqueous base. Use of organic solvents is frequently undesirable because of flammability, toxicity, and waste disposal considerations. The use of aqueous base is frequently undesirable because of toxicity, waste disposal, and corrosion problems. Thus there continues to be a need for improved photosensitive elements capable of reproducing images on a variety of receptors and that can be washed-out using aqueous solutions, preferably ordinary tap water.

Various processes are known for producing copies of images involving photopolymerization and thermal transfer techniques, such as those disclosed in U.S. Pat. Nos. 3,060,023; 3,060,024; 3,060,025; 3,481,736; 3,574,049 and 3,607,264. In these processes, a photopolymerizable layer coated on a support is imagewise exposed to a photographic transparency. The surface of the exposed layer is then pressed into contact with the image receptive surface of a separate element, and at least one of the elements is heated to a temperature above the transfer temperature of the unexposed portions of the layer. The two elements are then separated, whereby the unexposed image areas of the composite transfer to the image receptive element. If the element is not precolored, the tacky unexposed image may now be selectively colored with a toner. All of these processes necessitate the use of specially treated final receptor sheets and are not applicable for obtaining a color proofing image on a paper stock.

In the production of color printing proofs, transfer the color proofing image to actual printing paper stock is highly desired since the resulting proof usually will afford a more faithful and accurate reproduction of the proofing image to that produced on the press. Since paper stock is not resistant to the chemical processing steps required for obtaining an image, however, the image must first be formed and then transferred to the paper stock to create the color proof.

Methods for forming a color image on certain paper stocks are described in U.S. Pat. Nos. 4,766,053, 5,109,471 and 5,059,509. These methods involve transferring the image to an image-receiving sheet and then further transferring the image to a permanent support. For multicolor images, these methods are disadvantageous in that the individual color images must be laminated together in register after the individual images are formed. The lamination step requires a great deal of skill and care for high quality reproductions, and becomes increasingly difficult as the size of the work increases. Furthermore, the developer for these processes is a basic solution optionally containing organic components that can present waste disposal, corrosion, and toxicity problems.

Another method for forming a color image on diverse paper stocks is described in U.S. Pat. No. 5,094,931. In this method, a photosensitive element on a substrate is laminated to a temporary element and exposed, with substrate then being removed before development. After development, the steps are repeated with another color. A protective element, including an additional adhesive layer, is then laminated to the colored image. After removal of the support of the temporary element, the colored image with protective element is laminated to a permanent receiver, which can be a diverse paper stock. A disadvantage of this method is that it includes at least one extra layer in the color image composite that is nonessential to the color image and which detracts from the quality of the image reproduction. A second disadvantage is that the developer is a basic solution that can present waste disposal, corrosion, and toxicity problems.

It is an object of the present invention to provide a process to obtain a color image on virtually any paper stock in which the image contains the minimal number of layers essential for image formation, and for which the registration of different colored images is accomplished easily. Such a color image will provide a color proof that is a more faithful reproduction to an on-press print. It is also desired to do the development steps using tap water as the liquid developer, to minimize or eliminate the waste disposal, corrosion, and toxicity problems associated with the imaging process.

SUMMARY OF THE INVENTION

The invention provides a process for forming a colored image, the process comprising, in order:
(A) imagewise exposing to actinic radiation a photosensitive element comprising, in order,
 (1) a carrier support, said carrier support being resistant to aqueous liquid development,
 (2) a carrier surface layer selected from the group consisting of (i) a release layer and (ii) a cushion layer having a release surface,
 (3) a first adhesive layer
 (4) a first photosensitive layer comprising, (a) an aqueous liquid developable photosensitive composition, and (b) a colorant;
(B) developing the exposed first photo-sensitive layer from step (A) by washing with an aqueous liquid, thereby removing either the imagewise exposed or imagewise unexposed regions, to produce a first colored pattern;
(C) laminating to the element from step (B) a transfer element, said transfer element comprising,
 (1) a transfer support
 (2) a transfer surface layer selected from the group consisting of (i) a second release layer and (ii) a second cushion layer having a release surface, wherein the transfer surface layer is adjacent to the first colored pattern in the element from step (B);
(D) removing said carrier support and said carrier surface layer, revealing the adhesive layer;

(E) laminating the element from step (D) to a permanent support, wherein the adhesive layer is adjacent to the permanent support; and (F) removing said transfer support and said transfer surface layer;

wherein the adhesion force between said carrier support and said carrier surface layer has a value of F1, the adhesion force between said carrier surface layer and said adhesive layer has a value of F2, the adhesion force between said adhesive layer and said first colored pattern layer has a value of F3, the adhesion force between said first colored pattern layer and said transfer surface layer has a value of F4, the adhesion force between said transfer surface layer and said transfer support has a value of F5, and the adhesion force between said adhesive layer and said permanent support has a value of F6; and wherein each of F1, F3, F4, and F5 is greater than F2, and each of F3, F5, and F6 is greater than F4.

Optionally, this process can be employed to form a multi-colored image. In this case, said steps (A) and (B) above are repeated the desired number of times to form two or more exposed and washed-out photosensitive layers comprising the multi-colored image, which said exposed and washed-out photosensitive layers may each contain a different colorant.

The invention also provides an imaged element comprising, in order:

(1) a carrier support;

(2) a carrier surface layer;

(3) a first colored pattern layer, resulting from the imagewise exposure and washout development of a first photosensitive layer comprising
   (a) an aqueous liquid developable photo-sensitive composition, and
   (b) a colorant;

(4) a transfer surface layer; and (5) a transfer support wherein the adhesion force between said carrier support and said carrier surface layer has a value of F1, the adhesion force between said carrier surface layer and said adhesive layer has a value of F2, the adhesion force between said adhesive layer and said first colored pattern layer has a value of F3, the adhesion force between said first colored pattern layer and said transfer surface layer has a value of F4, and the adhesion force between said transfer surface layer and said transfer support has a value of F5; and wherein each of F1, F3, F4, and F5 is greater than F2.

In a preferred embodiment, the liquid for development is water, and the photosensitive material is an aqueous-processable derivative of polyvinyl alcohol containing photo-crosslinkable groups selected from the group consisting of N-alkyl styrylpyridinium and N-alkyl styrylquinolinium.

DETAILED DESCRIPTION OF THE INVENTION

In the process of this invention, a carrier support is used to build up a colored image consisting of either a single imaged color layer or multiple imaged color layers, each interleaved and bonded together with an adhesive layer. Either one color or multiple color images can be built up on the carrier support by executing either a single imaging step or multiple imaging steps, respectively. After the colored image has been formed, a transfer element is employed to effect a double transfer of the colored image, ending with transfer of the colored image from the transfer element (which image is wrong-reading) to the permanent support to afford a right-reading image. This invention provides for full color surprint proofs on virtually any proofing paper stock or other permanent support. It also provides for development during imaging with tap water as the liquid developer to minimize or eliminate concerns regarding toxicity, waste treatment, and corrosion.

In practicing the process, at least three elements are used: (I) a photosensitive element on a carrier support; (II) a transfer element; and (III) a permanent support element. The photosensitive element can be formed from (IA) a colored element and (IB) a carrier element. Additional colored elements are also used in making multicolor images.

In order to facilitate understanding of the process of the invention, the individual elements will be described in detail first.

Photosensitive Element

Figure 1:
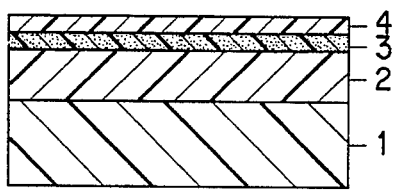
FIG. 1 illustrates the photosensitive element used in the process of the invention.

The photosensitive element is shown in FIG. 1. The element comprises, in order, a carrier support 1, a carrier surface layer 2, an adhesive layer 3, and a photosensitive layer 4.

The carrier support and the carrier surface layer serve as a temporary receptor upon which the colored image, comprising one or more imaged colored layers interleaved with adhesive layers, can be constructed. The photosensitive layer is exposed and developed while on the carrier support.

The carrier support 1 is constructed of a material which has sufficient stiffness and dimensional stability to support an image without allowing it to shift and misalign. The material used for the carrier support also should be sufficiently water resistant to allow for aqueous development of the photosensitive layer without warping or shrinking. The support is generally smooth and flat. Examples of suitable materials include polymeric films such as polyesters, including polyethylene terephthalate and polyethylene naphthanate; polyamides; polycarbonates; fluoropolymers; polyacetals; polyolefins; etc. The carrier support can also be a thin metal sheet or a paper substrate or synthetic paper that has been treated to be water resistant. The carrier support may be transparent, translucent, opaque, or colored, and may have additives such as antihalation dyes, etc. A preferred carrier support material is polyethylene terephthalate film. The carrier support typically has a thickness of about 20 to 250 micrometers (1.0 to 10 mils), with 75 to 200 micrometers (3 to 8 mils) being preferred.

The carrier support can have an antistat layer coated on one or both sides to reduce static when the carrier support is removed from the photosensitive element by peeling off, as will be discussed below. It is generally preferred to have an antistat layer coated on the back side of the carrier support, i.e., the side opposite that bearing the photosensitive layer. Materials which can be used as antistat materials are well known in the art.

The carrier surface layer 2 is either a release layer or a cushion layer. The carrier surface layer should have sufficient adhesion to (i) the carrier support to remain affixed to that support throughout all the process steps, and (ii) the adhesive layer to remain affixed thereto during aqueous development of the photosensitive layer. However, the adhesion of the carrier surface layer to the adhesive layer should be low enough to permit removal of the carrier support and the carrier surface layer subsequent to the aqueous development steps. The relative adhesion balances will be discussed in greater detail below.

Release layers generally are very thin layers which promote the separation of layers. Materials useful as release layers are well known in the art and include, for example, silicones; melamine acrylic resins; vinyl chloride polymers and copolymers; vinyl acetate polymers and copolymers; plasticized polyvinyl alcohols; etc. The term "release layer" as used herein includes a release surface on a support material. Thus, when a material having a release surface is used as the carrier support (e.g., polyethylene or a fluoropolymer) no additional release layer is needed. When a separate release layer is coated onto the carrier support, the layer generally has a thickness in the range of 1 to 10 micrometers.

A second, and preferred, type of carrier surface layer is a cushion layer having a release surface. The cushion layer is a deformable layer that is generally thicker than a release layer. Surprisingly, it was found that the inclusion of a cushion layer on the carrier support resulted in several advantages in the process of the invention when forming multicolor images. Namely, the amount of mottle caused by incorporation of entrapped air during lamination steps was greatly reduced; lamination temperatures could be reduced; and the adhesion between colors was improved.

The carrier cushion layer has a release surface to allow for separation of the carrier support and carrier cushion layer from the adhesive layer subsequent to aqueous development of the photosensitive layer. Examples of suitable materials which can be used as the carrier cushion layer include ethylene/methacrylic acid copolymers and ionomers; ethylene/acrylic acid copolymers and ionomers; ethylene/vinyl acetate copolymers; ethylene homopolymers; propylene homopolymers; ethylene/propylene copolymers; ethylene/methacrylate copolymers; ethylene/methacrylic acid/isobutylacrylic acid ionomers; and the like. Mixtures of materials can also be used. Preferred materials for the carrier cushion layer are ethylene/methacrylic acid and ethylene/acrylic acid copolymers and ionomers. Such materials are commercially available as Surlyn® 1601 (E. I. du Pont de Nemours and Company, Wilmington, Del.) and Iotek® 4080 (Exxon Chemical Co., Houston, Tex.).

The carrier cushion layer also can include additives such as antistats, colorants, antihalation dyes, optical brighteners, surfactants, plasticizers, coating aids, and the like. For example, it can be advantageous to include a white pigment in the carrier cushion layer to facilitate inspection of the colored image formed thereon. In general, these additional materials will constitute less than about 10% by weight, based on the total weight of the carrier cushion layer; preferably less than about 5% by weight. The carrier cushion layer generally has a thickness of about 12 to 150 micrometers (0.5 to 6 mils); preferably 35 to 65 micrometers (1.4 to 2.6 mils).

It may be desirable to include one or more anchor layers between the carrier cushion layer and to carrier support to ensure adequate adhesion. By "anchor layer" it is meant a layer that remains adhesively bonded to the layers on both sides, i.e., the layer above it and the layer below it. Adhesive materials for bonding different types of materials are well known in the art. A useful discussion is found in *Handbook of Adhesives*, 2nd Edition, Irving Skeist, Ed. (Van Nostrand Reinhold Co., New York, 1977). Conventional adhesive materials can be used in the anchor layer or layers, provided the selected material is not adversely affected by the aqueous development step. Suitable materials include, for example, ethylene/vinyl acetate copolymers; vinyl chloride/vinyl acetate copolymers; vinyl chloride/vinylidene chloride copolymers; thermoplastic polyamides; and the like. The exact choice of adhesive will depend on the compositions of the carrier cushion layer and the carrier support. The anchor layer or layers can have incorporated therein materials such as antistats, colorants, antihalation dyes, optical brighteners, surfactants, plasticizers, coating aids, and the like. The carrier anchor layer generally has a thickness in the range of 0.1 to 10 micrometers; preferably 0.5 to 2 micrometers. When more than one anchor layer is present, the total thickness of the layers is generally in the above range.

Adhesive layer 3 remains affixed to the photosensitive layer throughout the process. This layer can be any suitable composition having the necessary adhesion to the photosensitive layer and which does not interfere with the function of the photosensitive layer. For example, the selected adhesive should not contain components that would leach into the photosensitive layer or the resulting imaged layer. As discussed above adhesive materials for bonding different types of materials are well know in the art and are discussed for example, in *Handbook of Adhesives*, 2nd Edition, Irving Skeist, Ed. (Van Nostrand Reinhold Co., New York, 1977). The particular adhesive selected will depend on the nature of the photosensitive layer and the carrier cushion layer. Examples of suitable types of adhesives include polyester resins and vinylacetate copolymers with ethylene and/or vinyl chloride. The adhesive layer 3 generally has a thickness in the range of 0.1 to 10 micrometers; preferably 0.5 to 2 micrometers.

Photosensitive layer 4 is an aqueous liquid developable photosensitive composition which has a change in solubility upon exposure to actinic radiation. The photosensitive composition can be photoinsolubilizable; i.e., before exposure the photosensitive composition may be removed from the carrier support by water or by aqueous solutions that consist essentially of water, but is not so removable from the carrier support after exposure.

Alternatively, the photosensitive composition can be photosolubilizable. In this case, before exposure the photosensitive composition is not removable from the support by water or by aqueous solutions that consist essentially of water, but the composition is so removable from the support after exposure.

Photoinsolubilization is generally achieved by photoinitiated polymerization and/or crosslinking reactions that increase molecular weight and/or cause network formation, to insolubilize the photosensitive material.

Derivatives of water soluble polymers, such as polyvinyl alcohol that has pendant photocrosslinkable groups, can be used to advantage in the photosensitive layer. Upon exposure, these groups react to form crosslinks between different polymer chains. Suitable photocrosslinkable polymers are described in A. Reiser, *Photoreactive Polymers: The Science and Technology of Resists*, Wiley, New York, 1989, pp 24–32. Typical photocrosslinkable groups are, for example, the cinnamyl, chalcone, alpha-phenylmaleimide, N-alkyl styrylpyridinium, and N-alkyl styrylquinolinium groups.

Derivatives of polyvinyl alcohol are preferred, such as those having N-alkyl styrylpyridinium or N-alkyl styrylquinolinium groups. Such polymers are described in K. Ichimura and S. Wantanabe, *J. Polym. Sci., Polym. Lett. Ed.*, 18, 613 (1980) and 20, 1411, 1419 (1982) as well as in Ichimura, U.S. Pats. Nos. 4,272,620, 4,287,335, 4,339,524, 4,564,580 and 4,777,114. The disclosure of these references is incorporated herein by reference.

Substituted aqueous-processable polyvinyl alcohol polymers are typically prepared by derivatization of saponified polyvinyl acetate with the appropriate photo-crosslinking group. It is desirable for the oolyvinyl acetate to be at least 70% hydrolyzed. Typically 88% saponified polyvinyl acetate is used, but polyvinyl acetate which is more or less highly saponified can be used provided the photosensitive layer is aqueous-processable. The photocrosslinkable group can be attached to the polyvinyl alcohol by any appropriate chemical linkage, such as an ester, ether, or acetal linkage. The acetal linkage is preferred. Typically the 0.5–10 mol % photocrosslinkable groups, preferably 1–4 mol %, are present. Although polymers containing higher amounts of photocrosslinkable groups typically cannot be made to be aqueous-processable, higher amounts of photocrosslinkable groups can be used, provided the photosensitive layer is aqueous-processable. The degree of polymerization of the polyvinyl alcohol, i.e., the number of monomer units in the polymer chain, is advantageously in the range of 400 to 3,000. When the polymerization degree is too low, the exposure time required for insolubilization is lengthened. When the polymerization degree is too large, the viscosity of solutions containing the polymer becomes so large that they are difficult to prepare and handle.

Bis-azides are another class of polyfunctional photoactivatable crosslinking agents that may be selected. These compounds are typically aromatic bisazides substituted with one or more ionic groups, such as sulfonate, carboxylate, sulfate, etc., to increase water solubility. Representative bis-azides that may be selected include sodium 4,4'-diazidostilbene-2,2'-disulfonate, sodium 4,4'-diazidobenzalacetophenone-2-sulfonate, and sodium 4,4'-diazidostilbene-alpha-carboxylate. A preferred bis-azide is sodium 4,4'-diazidostilbene-2,2'-disulfonate. Equivalent results may be obtained by selecting bis-azides that contain other cations in place of sodium, such as potassium, ammonium, and substituted ammonium compounds such as ethyl ammonium, tetramethyl ammonium, etc.

Photosensitive diazo resins are another class of photosensitive materials that may be selected. These materials typically consist of aromatic diazonium salts crosslinked with formaldehyde. Representative materials are: the zinc chloride complex of the 4-(phenylamino)-benzenediazonium sulfate (1:1) formaldehyde polymer, the zinc chloride complex of the 4-(phenylamino)-benzenediazonium phosphate (1:1) formaldehyde polymer, the cobalt chloride complex of the 4-(phenylamino)-benzenediazonium (1:1) formaldehyde polymer, the uncomplexed 4-(phenylamino)-benzenediazonium phosphate (1:1) formaldehyde polymer, and the uncomplexed 4-(phenylamino)-benzenediazonium sulfate (1:1) formaldehyde polymer. Since their development does not produce effluent containing heavy metals, the uncomplexed 4-(phenylamino)-benzenediazonium phosphate (1:1) formaldehyde polymer and the uncomplexed 4-(phenylamino)-benzenediazonium sulfate (1:1) formaldehyde polymer are preferred.

Photosolubilization is generally achieved by photoinitiated conversion of materials to more soluble forms, plasticization reactions, depolymerization, uncoupling or uncrosslinking reactions. Systems based on o-quinone diazides and low molecular weight phenolformaldehyde polymers can be used to advantage. Upon exposure to ultraviolet radiation, the o-quinone diazide is converted to the readily dissolved indene carboxylic acid. A discussion of such systems can be found in A. Reiser, *Photoreactive Polymers: The Science and Technology of Resists*, Wiley, New York, 1989, pp 178–225.

In most cases, the photosensitive layer contains a colorant, i.e., is precolored. Usually, this is accomplished by incorporating a suitable dye or pigment into the photosensitive composition. The colorant typically will be one of the four standard colors employed in color proofing (i.e., yellow, magenta, cyan, and black) or any other desired color. The colorants which can be used are well known to those skilled in the art. The colorant should be compatible with the photosensitive composition and disperse uniformly therein, and preferably should not strongly absorb radiation in the spectral range in which the photoinitiator absorbs radiation. Pigments which are dispersible in water are preferred.

Alternatively, the colorant can be added by toning the surface of the photosensitive layer provided that the layer has sufficient tackiness to accept toner. The toner can be added by dusting with colored particulate toner materials, or by the application of precolored toning foils. Such processes are well known and have been described in, for example, U.S. Pat. Nos. 4,414,916 and 4,806,451.

Other conventional additives can be added to the photosensitive layer provided they are compatible with the other ingredients present in the layer, do not impart unwanted color to the final image, and do not adversely affect the performance of the element during either the imaging process or the multiple transfers involved during transfer of the image. In some cases separate photoinitiators are added. Other components can include, for example, polymeric binders, olasticizers, antihalation agents, optical brightening agents, release agents, surfactants, coating aids, and the like for conventional purposes.

The photosensitive material is present in sufficient amount to solubilize or insolubilize the photosensitive layer on exposure to actinic radiation. The photosensitive composition must contain sufficient polymer, either as part of the photosensitive material and/or as added binder, to form a film when coated to form the photosensitive layer. The colorant must be present in a sufficient amount to uniformly color the image to a sufficient optical density, but not in such a large amount that it adversely affects properties of the photosensitive layer such as photospeed, adhesion, etc. For surprint proofs, optical densities between 1 and 2 are desirable. Other ingredients should be present in amounts necessary to achieve their desired purposes, but not in such large amounts that they adversely affects the properties of the imaging system.

The composition of the photosensitive layer, expressed in percent by weight based on the total weight of the photosensitive layer, is typically: binder 70–95%, preferably 75–93%; photosensitive material 2–10%, preferably 2–6%; colorant 2–20%, preferably 4–16%; and other ingredients 0–2%. If no binder is present, i.e., the photosensitive material also functions as a binder, the composition is typically: photosensitive material 70–96%, preferably 80–96%; colorant 2–20% preferably, 4–16%; and other ingredients 0–2%. The photosensitive layer generally has a thickness in the range of 0.1 to 10 micrometers; preferably 0.5 to 2 micrometers.

The photosensitive element can be made by coating all of the layers, in order, onto the carrier support using any conventional coating and/or lamination techniques. It frequently is convenient to prepare the photosensitive element by laminating together two preformed elements, namely (A) a colored element and (B) a carrier element.

A. Colored Element

Figure 2:
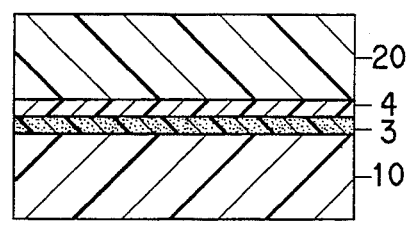
FIG. 2 illustrates the colored element which can be used in the process of the invention.

The colored element is shown in FIG. 2. The element comprises, in order, an optional temporary coversheet 10, an adhesive layer 3, a photosensitive layer 4, and a temporary support 20. The adhesive layer 3 and the photosensitive layer 4 have the composition discussed above.

The optional temporary coversheet 10 protects the element from being scratched or otherwise damaged prior to use. The temporary coversheet can be any material that affords adequate protection of the underlying adhesive layer and cleanly releases from that adhesive layer by peeling. Preferred coversheets are release films such as polyethylene or polyethylene terephthalate. These release films can be coated with release layers, such as silicone, provided the release layer is removed cleanly with the release film. The thickness of the temporary coversheet is not critical, but typically is in the range of 25 to 250 micrometers (1 to 10 mils).

The temporary support 20 is any dimensionally stable sheet material. Typically a polymeric film is used. The support should be removable from the photosensitive layer prior to exposure to actinic radiation. At the same time, there must be sufficient adhesion between the photosensitive layer and the temporary support to allow for manufacture and handling of the photosensitive element. Preferably, a separate release layer can be situated between the support and the photosensitive layer. Alternatively, a silicone release-treated film can be selected. The release layer or film allows for adjustment of the adhesion force between the photosensitive layer and the temporary support with respect to the other adhesion forces present, as will be discussed in detail below. The thickness of temporary support 20 is sufficient to impart the necessary stiffness for handling and dimensional stability, and is generally in the range of 25 to 250 micrometers (1 to 10 mils).

The colored element typically is prepared by coating each of the individual layers onto the temporary support. Preferably, the photosensitive layer is prepared by suspending or dissolving the ingredients in an appropriate solvent, typically aqueous; coating onto the temporary support; and evaporating the solvent.

B Carrier Element

Figure 3:
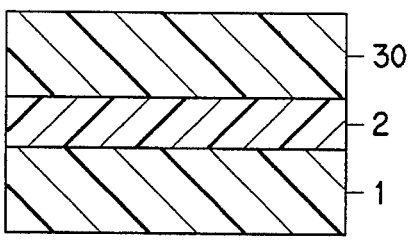
FIG. 3 illustrates the carrier element which can be used in the process of the invention.

The carrier element is shown in FIG. 3. The element comprises, in order, a carrier support 1, a carrier surface layer 2, and a temporary coversheet 30. The carrier support and the carrier surface layer are discussed above. The temporary coversheet 30 can be selected from the same materials described for the temporary coversheet 10.

C. Preparation of the Photosensitive Element

The photosensitive element shown in FIG. 1 can be prepared from the colored element and the carrier element by laminating the two together. The two temporary coversheets, 10 and 30, are first removed and the two elements then are placed together such that the adhesive layer 3 is adjacent to the carrier surface layer 2. The temperature and pressure used in the lamination step will depend on the composition of adhesive layer 3 and carrier surface layer 2. Typically, the lamination step is carried out in a temperature range of about 35° to 150° C. at a load of 100 to 1000 lbs. Temporary support 20 is then peeled off. When a release layer is present between the temporary support and the photosensitive layer, the release layer is peeled off with the temporary support and does not remain on the photosensitive layer.

It will be evident to those skilled in the art that, in order to remove the two temporary coversheets, the adhesion force between each of the temporary coversheets and their adjacent layers must be lower than the adhesion forces between all the other layers in their respective elements. It will also be clear that, in order to remove the temporary support 20 and the associated release layer (if present) after the lamination step, the adhesion force between the photosensitive layer 4 and temporary support 20 or the release layer (if present) must be lower than the adhesion force between the photosensitive layer 4 and adhesive layer 3, the adhesion force between the adhesive layer 3 and the carrier surface layer 2, and the adhesion force between the carrier surface layer 2 and the carrier support 1.

Transfer Element

The function of the transfer element is to serve as a temporary receptor to receive the colored image after it has been formed on the carrier support and to provide adequate support for the image to maintain its integrity until it has been transferred to the permanent support.

Figure 4:
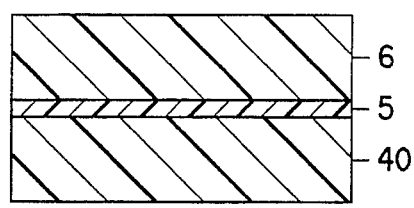
FIG. 4 illustrates the transfer element which is used in the process of the invention.

The transfer element is shown in FIG. 4. The element comprises, in order, an optional temporary coversheet 40, a transfer surface layer 5, and a transfer support 6.

The transfer support 6 is constructed of a material having sufficient stiffness and dimensional stability to support an image without allowing it to shift and misalign. The support is generally smooth and flat. Examples of suitable materials are polymeric films such as polyesters, typically polyethylene terephthalate or polyethylene naphthanate; polyamides; polycarbonates; fluoropolymers; polyacetals; polyolefins; etc. The transfer support also may be a thin metal sheet or a paper substrate or synthetic paper. Polyethylene terephthalate film is preferred. The transfer support typically has a thickness of about 20 to about 250 micrometers (1.0 to 10 mils). A preferred thickness is about 75 to 200 micrometers (3 to 8 mils).

Transfer surface layer 5 is either (i) a release layer, or (ii) a cushion layer, and has sufficient adhesion to the transfer support to remain affixed to that support throughout all the process steps. At the same time, the adhesiveness of the transfer surface layer is carefully balanced with the adhesiveness of the carrier surface layer in order to carry out the transfer steps discussed in greater detail below.

As discussed above in conjunction with the carrier surface layer, release layers promote the separation of layers. Materials useful in forming release layers are well known in the art and include for example, silicones; vinyl chloride polymers and copolymers; vinyl acetate polymers and copolymers; plasticized polyvinyl alcohols; etc. As used herein the term "release layer" also encompasses a release surface on a support material. Thus, when a material having a release surface is used as the transfer support (e.g., polyethylene or a fluoropolymer) no additional release layer is needed. The support material constitutes the transfer support 6, and the release surface constitutes the transfer surface layer 5. When a separate release layer is coated onto the transfer support, the layer generally has a thickness in the range of 1 to 10 micrometers.

The preferred type of transfer surface layer is a cushion layer having a release surface. As with the carrier cushion layer, the transfer cushion layer is a deformable layer which is generally thicker than a release layer.

The transfer cushion layer has a release surface to allow for separation of the transfer support and transfer cushion layer from the temporary coversheet 40, and from any layers which are subsequently laminated to the transfer cushion layer. As mentioned above, the composition of the transfer cushion layer should be chosen so as to produce the appropriate adhesiveness relative to the carrier cushion layer. Examples of suitable materials include ethylene/vinyl acetate copolymers; ethylene/methacrylic acid copolymers and ionomers, generally having a higher methacrylic acid content than when used as a carrier cushion layer; ethylene/acrylic acid copolymers and ionomers, generally having a higher acrylic acid content than when used as a carrier cushion layer; ethylene/methacrylate copolymers; ethylene/methacrylic acid/isobutylacrylic acid ionomers, generally having a higher methacrylic acid and isobutylacrylic acid content than when used as a carrier cushion layer; and the like. Mixtures of materials can also be used. Preferred materials for the transfer cushion layer are ethylene/vinyl acetate copolymers. The transfer cushion layer also can contain materials such as surfactants, plasticizers, coating aids, and the like. In general, colorants, antihalation dyes, optical brightener, etc., are not used in the transfer cushion layer as they serve no added purpose in this layer. The transfer cushion layer generally has a thickness in the range of about 25 to 150 micrometers (1 to 6 mils); preferably 75 to 125 micrometers (3 to mils).

In order to ensure adequate adhesion of the transfer cushion layer to the transfer support, it may be necessary to include one or more anchor layers between them. Adhesive materials for bonding different types of materials are well known in the art and discussions can be found in, e.g., *Handbook of Adhesives*, 2nd Edition, Irving Skeist, Ed. (Van Nostrand Reinhold Co., New York, 1977).

Conventional adhesive materials can be used in the anchor layer or layers. Suitable materials include, for example, ethylene/vinyl acetate copolymers; vinyl chloride/vinyl acetate copolymers; vinyl chloride/vinylidene chloride copolymers; thermoplastic polyamides; and the like. The exact choice of adhesive will depend on the compositions of the transfer cushion layer and the transfer support. The anchor layer or layers can have incorporated therein materials such as antistats, colorants, surfactants, plasticizers, coating aids, and the like. The transfer anchor layer generally has a thickness in the range of 0.1 to 10 micrometers; preferably 0.5 to 2 micrometers. When more than one anchor layer is present, the total thickness of the layers is generally in the above range.

The optional temporary coversheet 40 is present to protect the underlying layers, if necessary, and is easily removable. It can be selected from any of the materials discussed above for construction of the temporary coversheet 10.

Permanent Support Element

It is an advantage of this invention that the permanent support for the final colored image can be chosen from almost any sheet material desired. For most proofing applications a paper support is used, preferably the same paper on which the image will ultimately be printed. Virtually any paper stock can be used. Other materials that can be used are cloth, wood, glass, china, most polymeric films, synthetic papers, thin metal sheets or foils, etc. Almost any material which will adhere to the adhesive layer 3 can be used as the permanent support.

Process Steps

In the process, the colored image is first built up on the carrier support by exposing and developing by washout one or more colored photosensitive layers. The first photosensitive layer is present on the photosensitive element prior to exposure to actinic radiation, or it is laminated to the carrier element to form the photosensitive element prior to exposure to actinic radiation. Any additional colored elements are laminated onto the carrier support (over the previously developed image layers) prior to exposure to actinic radiation. All of the exposure and development steps take place while the photosensitive layer(s) are present on the carrier support. When all of the photosensitive layers have been added and developed, the colored image is transferred to a transfer element. At this point, the image is wrong-reading, i.e., a mirror image of the desired image. The colored image is then transferred a second time to the permanent support where it is right-reading.

The lamination steps throughout the process are typically carried out in a temperature range of about 35° to 150° C. at a load of 100 to 1000 lbs.

STEP A.

The first step in the process is to expose the photosensitive element shown in FIG. 1 to actinic radiation which is absorbed by the photosensitive resin to activate the imaging reaction in conventional fashion. "Actinic radiation" is any radiation which produces imaging. The radiation can be natural or artificial, monochromatic or polychromatic, incoherent or coherent. For efficient image formation, most of the actinic radiation should be absorbed by the photosensitive material. The absorption spectrum of the photosensitive material may be determined by conventional spectrophotometry.

Conventional sources of actinic radiation that may be selected include fluorescent, mercury vapor, mercury-xenon, metal additive, and arc lamps. Useful sources of coherent radiation, such as lasers whose emissions fall within or overlap the absorption bands of the photosensitive resin, also may be used. Exposure is ordinarily carried out through a halftone image-bearing transparency, preferably a halftone color separation transparency. However, other means, such as a modulated scanning laser beam, CRT (cathode ray tube), and the like, may be used to imagewise expose the photosensitive elements.

The element is exposed to actinic radiation, typically through a negative separation transparency with the emulsion side of the transparency in contact with the photosensitive layer. Exposure is conveniently carried out in a standard vacuum frame to ensure good contact between the transparency and the photosensitive layer.

STEP B.

The next step is to develop the photosensitive layer by washing out with an aqueous liquid. When the photosensitive layer is photoinsolubilizable, the aqueous liquid removes only the unexposed areas of the photosensitive layer. When the photosensitive layer is photosolubilizable, the aqueous liquid removes only the exposed areas of the photosensitive layer. As a result of the development step, a first colored pattern 4' is formed.

It is preferred that the development step be effected using ordinary tap water or the like to minimize concerns regarding toxicity, waste treatment, and corrosion. Development can either be done manually or using automated machines. It can be carried out at elevated temperatures, but in most cases room temperature is preferred.

STEP C.

For a single-color image, the next step in the process is to laminate the transfer element, shown in FIG. 4, to the element formed above. The temporary coversheet 40 is removed and the two elements are laminated together such that tile transfer surface layer 5 is adjacent to the first colored pattern, i.e., the developed photosensitive layer 4' as illustrated in FIG. 5.

Figure 5:
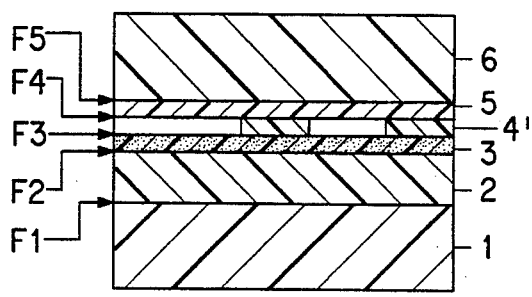
FIG. 5 illustrates a single-color intermediate imaged element.

The resulting element, called the intermediate imaged element, has the structure shown in FIG. 5. The adhesion forces between the individual layers have the following values:

$F1$=the adhesion force between the carrier support 1 and the carrier surface layer 2;

$F2$=the adhesion force between the carrier surface 2 layer and the adhesive layer 3;

$F3$=the adhesion force between the adhesive layer 3 and the developed photosensitive layer 4';

$F4$=the adhesion force between the developed photosensitive layer 4' and the transfer surface layer 5;

$F5$=the adhesion force between the transfer surface layer and the transfer support 6.

STEP D.

The next step in the process is to remove the carrier support having the carrier surface layer attached thereto. Thus the image is transferred to the transfer element. This step is accomplished by peeling the transfer support and the carrier support apart. In order to obtain the desired result, the adhesion values $F1$, $F3$, $F4$ and $F5$ must each individually be greater than the adhesion value $F2$.

STEP E.

Figure 6:
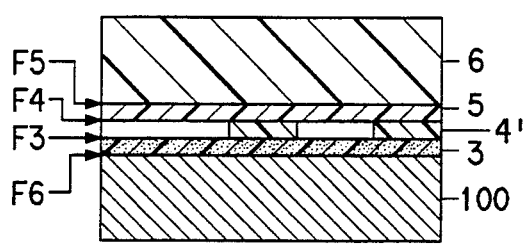
FIG. 6 illustrates a single-color image on a permanent support prior to removal of the transfer element.

The next step in the process of the invention is to laminate the permanent support, 100 to the element from above, such that the permanent support 100 is adjacent to the adhesive layer 3 as illustrated in FIG. 6. The adhesion force between the permanent support 100 and the adhesive layer 3 has a value $F6$.

STEP F.

The next step in the process is to remove the transfer support 6 with the transfer surface layer 5 attached thereto, thereby transferring the image to the permanent support. This step is accomplished by peeling the transfer support and the permanent support apart. In order to obtain the desired result, the adhesion values $F3$, $F5$, and $F6$ must each individually be greater than the adhesion value $F4$.

MULTICOLOR IMAGE FORMATION

When an image having more than one color is to be formed, the process begins with steps A and B as described above, to form a first colored pattern. This is followed by steps B1 through B5 prior to step C.

STEP B1.

Figure 7:
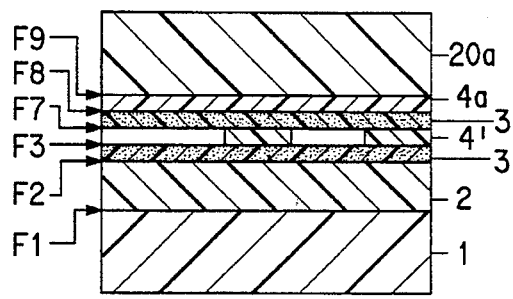
FIG. 7 illustrates an additional colored element on the photosensitive element after imaging and development of the first photosensitive layer.

The next step in the process of forming a multicolor image is to laminate an additional colored element, generally one having a color different from the first color, to the developed element from step B above. The additional colored element is analogous to that shown in FIG. 2, having a temporary coversheet 10a, an overlying additional adhesive layer 3a, an overlying additional photosensitive layer 4a, and an overlying temporary support 20a. The temporary coversheet 10a is removed from the additional colored element and the two elements are laminated such that the additional adhesive layer 3a is adjacent to and overlying the first colored pattern layer 4', as illustrated in FIG. 7.

The adhesion forces between the layers have the values $F1$, $F2$ and $F3$, as defined above, and in addition:

$F7$=the adhesion force between the first colored pattern layer 4' and the overlying additional adhesive layer 3a

$F8$=the adhesion force between the additional adhesive layer 3a and the overlying additional photosensitive layer 4a prior to exposure to actinic light $F9$=the adhesion force between the additional photosensitive layer 4a prior to exposure to actinic light and the overlying additional support 20a.

STEP B2.

The next step in the process is to remove the additional temporary support 20a. In order to obtain the desired result, the adhesion values $F1$, $F2$, $F3$, $F7$, and $F8$ must each individually be greater than the adhesion value $F9$.

STEP B3.

The next step in the process is to imagewise expose the additional photosensitive layer 4a in register with the first colored pattern layer 4'. Suitable registration techniques are well known in the art and include pin and bar registration. The exposure is carried out as described in step A.

STEP B4.

The next step in the process is to develop the element from step B3 using aqueous washout development as described in step B. This results in the formation of a second colored pattern layer 4a'.

STEP B5.

Steps B1 to B4 are repeated in order, one or more times to provide additional colors to the image. These steps are carried out using an additional colored element having additional adhesive layer 3b and overlying additional photosensitive layer 4b, an additional colored element having additional adhesive layer 3c and overlying additional photosensitive layer 4c, through the nth colored element having additional adhesive layer 3n and overlying additional photosensitive layer 4n. In each lamination step the colored element is laminated to the element from step B4 such that the additional adhesive layer is adjacent to and overlying the outermost colored pattern. It will be appreciated that for each repetition of step B2 in which the additional temporary support 20i (i.e., 20b, 20c, . . . 20n) is removed, the adhesion force between the additional temporary support 20i and the underlying unexposed additional photosensitive layer 4i is less than the adhesion forces between all of the other layers in the element.

STEP C.

Figure 8:
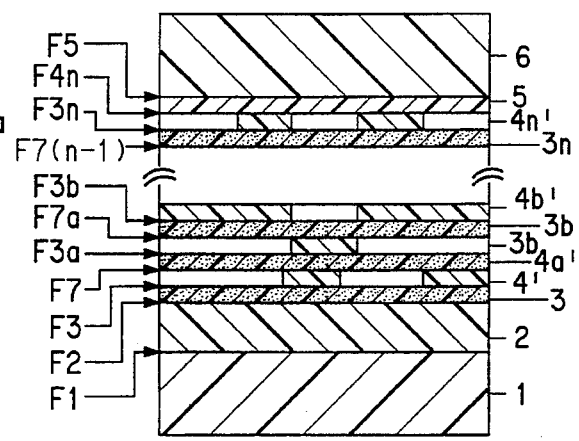
FIG. 8 illustrates a multicolor intermediate imaged element.

As illustrated in FIG. 8, the element from Step B5 is then laminated to the transfer element such that transfer surface layer 5 is adjacent to the outermost colored pattern layer 4n' and transfer support 6 is the outermost layer. The laminated element has a first colored pattern layer 4' and n additional colored pattern layers. The adhesion forces between the layers have the values $F1$, $F2$, $F3$ and $F5$, as defined above, and in addition:

$F7$=the adhesion force between the first colored pattern layer 4' and the overlying additional adhesive layer 3a

$F3a$=the adhesion force between additional adhesive layer 3a and the overlying additional colored pattern layer 4a'

F7a=the adhesion force between additional colored pattern layer 4a' and the overlying additional adhesive layer 3b F7(n−1)=the adhesion force between additional colored pattern layer 4(n−1)' and the overlying additional adhesive layer 3n F3n=the adhesion force between additional adhesive layer 3n and the overlying additional colored pattern layer 4n'

F4n=the adhesion force between the uppermost additional colored pattern 4' and the transfer surface layer 5.

In most cases, the same photosensitive composition will be used for all the photosensitive layers (except that the different layers will contain different colorants), and the same adhesive composition will be used for all the adhesive layers. In such cases F3a=F3b= . . . =F3n (which will also have the same value as F3). Similarly, F7a=F7b= . . . =F7(n−1). For clarity and ease of discussion, the term "F3i" will refer to each of the values F3a through F3n whether they are the same or different, and "F7i" will refer to each of the values F7a through F7(n−1), whether they are the same or different.

STEP D.

The carrier support 1, having the carrier surface layer 2 attached thereto, is then removed. Adhesion values F1, F3, F3i, F4n, F7 and F7i must be greater than the adhesion value F2 to achieve this result.

STEP E.

Figure 9:
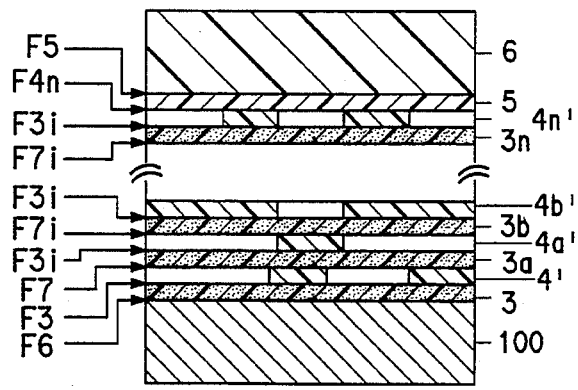
FIG. 9 illustrates a diagram of a multicolor image on a permanent support prior to removal of the transfer element.

Permanent support 100 is then laminated to the element from Step D, such that the permanent support is adjacent to the adhesive layer 3. This results in the structure shown in FIG. 9. The adhesion force between the permanent support 100 and the adhesive layer 3 has a value F6, as previously defined.

STEP F.

Figure 10:
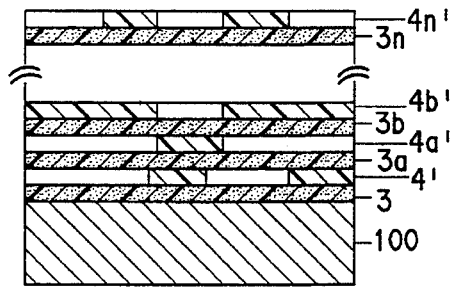
FIG. 10 illustrates a final multicolor image on a permanent support.

Transfer support 6 with the transfer surface layer 5 attached thereto is then removed, thereby transferring the image to the permanent support as illustrated in FIG. 10. This step is accomplished by peeling the transfer support and the permanent support apart. In order to obtain this result, adhesion values F3, F3i, F5, F6, F7, and F7i each are greater than the adhesion value F4n. It is clear from FIG. 10 that no additional layers have been added to the image structure as a result of the transfer steps. The only layers present, other than the permanent support, are colored pattern layers 4', 4a' . . . 4n' and associated adhesive layers 3, 3a . . . 3n.

ADHESIVE FORCES

There is a hierarchy of adhesion forces between the various layers in the various elements: the adhesion force between optional coversheet 10 and the underlying layer<F9<F2<F4 or F4n.

The lowest adhesion force is between optional coversheet 10 and the underlying layer since the coversheet must be easily removed. The next lowest is F9, the adhesion force between the additional temporary support (20a . . . 20n) and the additional photosensitive layer (4a . . . 4n) prior to exposure to actinic radiation. When additional colored elements are laminated to the developed element in step B1, the additional temporary support (and any associated release layer) must be removable from the resulting element without disturbing any of the other layers. The next lowest is F2, the adhesion force between the carrier surface layer 2 and the adhesive layer 3. After the formation of the imaged element (single-color or multicolor) it is necessary to remove the carrier support having the carrier surface layer attached thereto without disturbing any of the other layers. The adhesion of the carrier surface layer to the imaged element must be less than the adhesion of the transfer surface layer to the imaged element. The next lowest is F4 or F4n, the adhesion force between the transfer surface layer 5 and the uppermost colored layer 4' or 4n'. This adhesion force must be low enough to allow removal of the transfer support having the transfer surface layer attached thereto while the other layers remain affixed to the permanent support. In choosing the compositions for the various layers, this hierarchy of adhesion forces must be taken into consideration.

ALTERNATIVE EMBODIMENTS

The above process has been described in terms of using a different color in each additional colored element. It will be recognized that the same process steps can be carried out using the same color more than once. In most cases the color densities achieved from a single colored pattern are sufficient and it is not preferred to repeat a color because of the thickness added to the colored image.

The process and element of the invention have thus far been described in terms of precolored photosensitive layers. Although not preferred, there is an alternative embodiment, also within the scope of the invention, in which uncolored photosensitive layers are used and color is added in an additional step subsequent to washout development.

In this alternative embodiment, the photosensitive layers 4, 4a, 4b, . . . , 4n contain no pigment or other colorant. In the process, the first non-colored photosensitive layer 4 is exposed to actinic radiation and developed by washing out the soluble portions of that layer. This leaves portions of the underlying adhesive layer 3 uncovered. The element is then toned to produce a colored pattern if one of two conditions is met: (i) the adhesive layer is tacky at the toning temperature and the remaining photosensitive layer is nontacky at that temperature; or (ii) the adhesive layer is nontacky at the toning temperature and the remaining photosensitive layer is tacky at that temperature. In case (i) the uncovered underlying adhesive layer becomes colored. In case (ii) the remaining areas of the photosensitive layer become colored. The toning step can involve the application of colored particulate toner as described in, e.g., U.S. Pat. Nos. 4,414,916 and 4,053,313. It also can be accomplished by the application of a precolored toning foil as described in, e.g., U.S. Pat. No. 4,806,451. For multicolor images, each additional non-colored photosensitive layer, 4a through 4n, is exposed and developed by washout to uncover areas of underlying adhesive layers 3a through 3n, and toning is carried out as described above. The other process steps are the same as described above.

It is also possible to use a combination of both precolored photosensitive elements and non-colored photosensitive element(s) which are toned. This is particularly useful for making proofs that include one or more specialty colors in addition to the standard yellow, magenta, cyan and black. In most cases, the precolored photosensitive element will be applied to the carrier element first, followed by the application of non-colored photosensitive elements with toning as described above.

It should be noted that both the carrier element and the transfer element of the present invention can be used over and over again to form several colored or multicolored images.

INDUSTRIAL APPLICABILITY

The elements of this invention are useful for preparing colored images. These images are particularly useful in the graphic arts field, especially in the area of color proofing wherein proofs are prepared to duplicate the images produced by printing.

The advantageous properties of this invention can be observed by reference to the following examples which illustrate, but do not limit, the invention.

EXAMPLES

GLOSSARY

| | |
|---|---|
| C-6-CY-1 | Cyan pigment dispersion; Toyo Ink Mfg., Toyko, Japan |
| C-9-BK-2 | Black pigment dispersion; Toyo Ink Mfg., Toyko, Japan |
| C-9-MG-10 | Magenta pigment dispersion; Toyo Ink Mfg., Toyko, Japan |
| C-9-YL-5 | Yellow pigment dispersion; Toyo Ink Mfg., Toyko, Japan |
| Denka LAC TL-03 | Vinyl chloride/vinyl acetate copolymer; Denki Chemical |
| Dryer 900 | p-Toluenesulfonic acid; |
| Elvaloy® 741 | Ethylene/vinyl acetate copolymer; DuPont, Wilmington, DE |
| Elvax® 410, 550 | Ethylene/vinyl acetate copolymers; DuPont, Wilmington, DE |
| Iotek® 4080 | Ethylene/acrylic acid ionomer; Exxon Chemical, Houston, TX |
| Irgalite® Green GLN | phthalocyanine green pigment; Ciba-Geigy, Newport, DE |
| Macromelt® 6245 | Thermoplastic polyamide resin; Henkel Polymers Div. |
| Mizukasil SK7 | Silica particles; Mizusawa Industrial Chemicals |
| PET | Polyethylene terephthalate |
| Plascoate RY-1 | Fluoroakylbenzene sulfonate surfactant |
| Ryuron QU-628 | Vinyl chloride/vinyl propionate/-vinyl acetate/methyl methacrylate copolymer; Tosoh Corporation |
| SPP polymers | Polyvinyl alcohols acetalized with N-methyl-4-(p-formylstyryl)-pyridinium methosulfate; Toyo Gosei Kogyo Co., Ltd, Ichikawa City, Chiba Pref., Japan |
| Surlyn® 1650, 1605 | Ethylene/methacrylic acid ionomers; DuPont, Wilmington, DE |
| Tispeel XA51-824A | Melamine acrylic resin; Hitachi Kasei Polymer |
| Ucar® VYHH | Vinyl chloride/vinyl acetate copolymer; Union Carbide |
| Vylonal MD | Heat sealable polyester resin emulsions; Toyobo Co. |
| Zonyl® FSO-100 | Non-ionic fluorosurfactant; DuPont, Wilmington, DE |

EXAMPLES

Colored Elements.

The elements each had the following structure: (1) 1–2 micron adhesive layer; (2) 1–2 micron photosensitive layer; (3) an about 3 micron release layer; and (4) a temporary support of about 100 micron thick PET. The first adhesive layer contained: Elvaloy®741 (45 parts by weight), Ucar® VYHH (45 parts by weight), and Denka LAC TL-03 (10 parts by weight). It was coated from a solution of 80 parts by weight toluene and 20 parts by weight 2-butanone.

The composition of the photosensitive layers is shown in Table 1.

TABLE 1[a]

| | Yellow | Magenta | Cyan | Black |
|---|---|---|---|---|
| SPP-11KM | 66.3 | 72.7 | 79.8 | — |
| SPP-500KL | 22.1 | — | — | — |
| SPP-776 | — | 18.2 | 14.1 | — |
| SPP-200KM | — | — | — | 83.7 |
| C9-YL-5 | 9.8 | — | — | — |
| C9-MG-10 | — | 7.9 | — | — |
| C6-CY-1 | — | — | 4.9 | — |
| C9-BK-2 | — | — | — | 14.8 |
| Plascoate RY-1 | 1.7 | 1.2 | 1.2 | 1.5 |

[a]Percents by weight of the photosensitive layer

The release layer contained Tispeel XA51-824A (4.9 parts by weight), Ryuron QU-628 (93.2 parts by weight), and Dryer 900 (0.4 parts by weight).

Carrier Element.

The carrier element had the following structure: (1) an approximately 25 micron PET coversheet; (2) a 46 micrometer (1.8 mil) carrier cushion layer of Surlyn 1650; and (3) a 100 micrometer (4 mil) PET support.

Transfer Element.

The transfer element had the following structure: an approximately 25 micrometer (1 mil) PET coversheet on a 100 micrometer (4 mil) transfer cushion layer of Elvax 550 on a 100 micrometer (4 mil) PET support.

Forming a Colored Image on a Permanent Support

Step 1. The coversheet of the carrier element was removed by peeling. A black colored element was placed on top of the carrier element such that the adhesive layer was adjacent to the carrier cushion layer of the carrier element and then laminated to it using a WaterProof® laminator (100° C., 150 lbs, 400 mm/min). The support and release layer from the colored element were then peeled away to reveal the photosensitive black layer, thus producing the photosensitive element.

Step 2.

The photosensitive element from Step 1 was placed in a vacuum frame with the photosensitive layer up, i.e., facing the source of actinic radiation. A negative separation transparency for black with a standard UGRA control strip was placed on top of the photosensitive layer with the emulsion side of the transparency in contact with the photosensitive layer and the base side up. A vacuum was drawn on the element and separation transparency for about 90 sec prior to exposure. The element was exposed for about 30 sec with the radiation from a 6 kW high pressure mercury vapor lamp (Theimer Violux, Exposure Systems Company, Bridgeport, Conn., equipped with a photopolymer bulb) about 137 cm above the element and separation transparency. After exposure the separation transparency was removed from the exposed photosensitive element.

Step 3.

The element was then developed using a WaterProof® Washoff unit which utilized a 24° C. water stream and rotating brush to remove the non-exposed areas of the photosensitive layer, and a hot air section to dry the element (110° C., 76 cm/min. throughput).

Step 4.

A cyan colored element was then laminated to the black image on the carrier element in the same way as the black colored element had been. The additional temporary support and release layer cyan element were removed and then the element was positioned for exposure as described above, but using the negative separation transparency for cyan aligned in register with the black image. The element was exposed for 20 seconds and developed as described above for the black layer. The result was a two-color image on the carrier element.

Step 5.

The magenta colored element was then used as described above for cyan to obtain a 3-color image on the carrier element.

Step 6.

The yellow colored element was then used as described above for cyan, but with a 14 second imaging exposure, to obtain a 4-color image on the carrier element.

Step 7.

Double Transfer. The coversheet of the transfer element was removed by peeling. The element from Step 6 above was placed on the transfer element such that the outermost yellow image layer was adjacent to the transfer cushion layer, and laminated using the same lamination conditions as in Step 1. The carrier element was then removed by peeling off the carrier support. The carrier cushion layer was removed with the support. This effectively transferred the 4-color image to the transfer element as a wrong-reading image.

Step 8.

The 4-color image from Step 7 was placed on a piece of LOE paper stock such that the adhesive layer from the first black colored element was adjacent to the paper, and laminated at 100° C., 450 lbs, 400 mm/min. The transfer element was then removed by peeling off the transfer support. The transfer cushion layer was removed with the support. The result was a right-reading 4-color proof on LOE paper in which the uppermost layer was the yellow colored layer. Proof image results are shown in Table 2.

TABLE 2

| | Image Results | | | |
|---|---|---|---|---|
| Color | Color Density | UGRA % Dots | UGRA Resolution[a] | UGRA 50% Dot Gain |
| Yellow | 1.40 | 1–99 | 8 | 12 |
| Magenta | 1.55 | 1–99.5 | 8 | 14 |
| Cyan | 1.42 | 0.5–99.5 | 8 | 14 |
| Black | 1.79 | 1–99.5 | 8 | 14 |

[a]in micrometers

EXAMPLE 2

Photosensitive Element.

The colored element used for the 1st color had the following structure: 2 micrometer black colored photosensitive layer on a 2 micrometer adhesive layer on a 3 micrometer carrier release layer (carrier surface layer) on a 100 micrometer (4 mil) PET carrier support. The black photosensitive layer composition was the same as described in Example 1. The adhesive layer was comprised of Vylonal MD 1100 (70 parts by weight) and Vylonal MD 1400 (30 parts by weight). The carrier release layer was the same as that described in Example 1 but with the addition of 1.5 parts by weight of Mizukasil SK7.

Colored Elements.

The colored elements used for 2nd, 3rd and 4th colors were the same as those used for the corresponding colored elements described in Example 1.

Transfer Element.

The structure of the transfer element was the same as that described in Example 1.

Forming a Colored Image on a Permanent Support

Step 1.

The black photosensitive element was exposed for 52 seconds and developed as described in Steps 2 and 3 of Example 1.

Step 2.

The cyan colored element was then transferred to the black image and the additional temporary support removed by peeling. The element was exposed for 30 seconds, and developed as described in Step 4 of Example 1. The result was a 2-color image on the carrier support.

Step 3.

The magenta colored element was then transferred to the 2-color image and the additional temporary support removed by peeling. The element was exposed for 22 sec, and developed as described in Step 5 of Example 1. The result was a 3-color image on the carrier support.

Step 4.

The yellow colored element was then transferred to the 3-color image and the additional temporary support removed by peeling. The element was exposed for 14 sec, and developed as described in Step 6 of Example 1. The result was a 4-color image on the carrier support.

Step 5.

Double Transfer. The 4-color image was next transferred to the transfer element as described in Step 7 of Example 1. The result was a wrong-reading 4-color image on the transfer element.

Step 6.

The 4-color image on the transfer element was transferred to a piece of LOE paper stock to afford a right-reading 4-color image as described in Step 8 of Example 1. Proof image results are shown in Table 3.

TABLE 3

| | Image Results | | | |
|---|---|---|---|---|
| Color | Color Density | UGRA % Dots | UGRA Resolution[a] | UGRA 50% Dot Gain |
| Yellow | 1.36 | 1–99 | 8 | 14 |
| Magenta | 1.49 | 1–99.5 | 6 | 14 |
| Cyan | 1.40 | 0.5–99 | 6 | 18 |
| Black | 1.82 | 1–99.5 | 6 | 18 |

[a]in micrometers

Example 3

Photosensitive Element.

The photosensitive element used for the 1st color had the following structure: 2 micrometer thick black colored photosensitive layer on a 2 micrometer thick adhesive layer on a 100 micron thick carrier cushion layer on a 2 micron thick anchor layer on a 100 micron thick PET carrier support. The compositions for the photosensitive and adhesive layers are shown in Table 4. The carrier cushion layer was Surlyn® 1605. The anchor layer was Macromelt 6245, coated from a 3:1 mixture of 1-propanol:toluene.

TABLE 4

| | Photosensitive | Adhesive |
|---|---|---|
| SPP-H-126 | 45.0 | — |
| 9-BK-2 | 2.7 | — |
| Zonyl® FSO-100 | 0.05 | — |

TABLE 4-continued

|  | Photosensitive | Adhesive |
|---|---|---|
| Vylonal MD-1200 | — | 100 |
| Water | 52.2 | — |

Colored Element.

The additional colored element had the same composition as the cyan colored element described in Example 1.

Transfer Element.

The structure of the transfer element was the same as that described in Example 1, but the second cushion layer was comprised of Elvax® 410.

Forming a Colored Image on a Permanent Support

Step 1.

The black colored element was exposed for 52 seconds and developed as described in Steps 2 and 3 of Example 1.

Step 2.

The cyan colored element was then transferred to the black image, the support remove, the element exposed for 30 seconds, and developed as described in Step 4 of Example 1. The result was a 2-color image on the carrier support.

Step 3.

Double Transfer. The 2-color image was next transferred to the transfer element as described in Step 7 of Example 1. The result was a wrong-reading 2-color image on the transfer element.

Step 4.

The wrong-reading color image on the transfer element was transferred to a piece of LOE paper stock as described in Step 8 of Example 1, but using a lamination pressure setting of 300 lbs, to afford a right-reading 2-color image on the LOE paper stock.

Example 4

Colored Elements.

The colored element had the same structure and compositions as in Example 1.

Carrier Element.

The structure and compositions of the carrier element were the same as described in Example 1 except that the carrier cushion layer composition was 98.1% by weight Iotek® 4080 and 1.9% by weight Irgalite® Green GLN.

Transfer Element.

The transfer element was the same as described in Example 1.

Forming a Colored Image on a Permanent Support

Step 1.

Using the black, cyan, magenta and yellow colored elements, the 4-color image was assembled on the carrier support as described in Steps 1–6 of Example 1, but in the order cyan, magenta, yellow, and then black. Lamination set points of 120° C., 300 lbs, 400 mm/min. were used. An exposure time of approximately 40 seconds was used for each color.

Step 2.

Double transfer. The 4-color image was then transferred to the transfer element as described in Step 7 of Example 1, but using the same lamination conditions as in Step 1 above.

Step 3.

The 4-color image on the transfer element was then transferred to Kanzaki Golden task paper as described in Step 8 of Example 1, but using a lamination temperature of 120° C. Proof image results are shown in Table 5.

TABLE 5

| Color | Image Results | | | |
|---|---|---|---|---|
|  | Color Density | URGA % Dots | UGRA Resolution[a] | UGRA 50% Dot Gain |
| Yellow | 1.32 | 0.5–99.5 | 6 | 12 |
| Magenta | 1.50 | 0.5–99.5 | 6 | 14 |
| Cyan | 1.37 | 0.5–99.5 | 6 | 15 |
| Black | 1.73 | 0.5–99.5 | 6 | 16 |

[a]in micrometers

Having described the invention, we now claim the following and their equivalents.

What is claimed is:

1. A process for forming a colored image comprising, in order:

(A) imagewise exposing to actinic radiation a photosensitive element comprising, in order,
   (1) a carrier support resistant to aqueous liquid development,
   (2) a carrier surface layer selected from the group consisting of (i) a release layer and (ii) a cushion layer having a release surface,
   (3) a first adhesive layer
   (4) a first photosensitive layer comprising,
      (a) an aqueous liquid developable photosensitive composition, and
      (b) a colorant;

(B) developing the exposed first photosensitive layer from step (A) by washing with an aqueous liquid, thereby removing either the imagewise exposed or imagewise unexposed regions, to produce a first colored pattern;

(C) laminating to the element from step (B) a transfer element, said transfer element comprising,
   (1) a transfer support, and
   (2) a transfer surface layer selected from the group consisting of (i) a second release layer and (ii) a second cushion layer having a release surface,
      wherein the transfer surface layer is adjacent to a colored pattern in the element from step (B) with the proviso that the transfer element does not have an adhesive layer which transfers to the colored pattern;

(D) removing said carrier support and said carrier surface layer, revealing the adhesive layer;

(E) laminating the element from step (D) to a permanent support, wherein the adhesive layer is adjacent to the permanent support; and (F) removing said transfer support and said transfer surface layer;

wherein the adhesion force between said carrier support and said carrier surface layer has a value of F1, the adhesion force between said carrier surface layer and said adhesive layer has a value of F2, the adhesion force between said adhesive layer and said first colored pattern layer has a value of F3, the adhesion force between said first colored pattern layer and said transfer surface layer has a value of F4, the adhesion force between said transfer surface layer and said transfer support has a value of F5, and the adhesion force between said adhesive layer and said permanent support has a value of F6; and wherein each of F1, F3, F4, and F5 is greater than F2, and each of F3, F5, and F6 is greater than F4; and additionally comprising, in order following step (B):

(B1) laminating to the element from step (B) a colored element, said colored element comprising,
  (1) an additional support,
  (2) an underlying additional photosensitive layer comprising,
    (a) an aqueous liquid developable photosensitive composition, and
    (b) a colorant, and
  (3) an underlying additional adhesive layer; wherein the additional adhesive layer is adjacent to and overlying the first colored pattern in the element from step (B);
(B2) removing said additional support;
(B3) imagewise exposing to actinic radiation said additional photosensitive layer in register with the previously formed first colored pattern;
(B4) developing said exposed additional photosensitive layer from step (B3) by washing with an aqueous liquid, thereby removing either the imagewise exposed or imagewise unexposed regions, to produce an additional colored pattern;
(B5) optionally repeating, in order, steps (B1) to (B4) one or more times;
wherein the adhesion force between any of the additional photosensitive layers prior to exposure to actinic radiation and its overlying additional support has a value less than each of F1, F2 and F3 and is less than each of the adhesion forces between adhesive layers and adjacent photosensitive layers or colored patterns; wherein the adhesion force between said additional adhesive layer and said underlying first colored pattern layer has the value F7, the adhesion force between any of said additional adhesive layers and the underlying additional colored pattern has the value F7$i$, the adhesion force between any of said additional adhesive layers and the overlying additional colored pattern has the value F3$i$, and the adhesion force between the uppermost additional colored pattern layer and said transfer surface layer has a value F4$n$, and wherein each of F1, F3, F3$i$, F4$n$, F5, F7 and F7$i$ is greater than F2, and
each of F3, F3$i$, F5, F6, F7 and F7$i$ is greater than F4$n$.

2. A process for forming a colored image, said process comprising, in order:
(A imagewise exposing to actinic radiation a photosensitive element comprising, in order,
  (1) a carrier support resistant to aqueous liquid development,
  (2) a carrier surface layer selected from the group consisting of (i) a release layer and (ii) a cushion layer having a release surface,
  (3) a first adhesive layer
  (4) a first photosensitive layer comprising, an aqueous liquid developable photosensitive composition,
(B) washing the exposed first photosensitive layer from step (A) an aqueous liquid, thereby removing either the imagewise exposed or imagewise unexposed regions,
(C) toning the element from step (B) to produce a first colored pattern;
(D) laminating to the element from step (C) a transfer element, said transfer element comprising,
  (1) a transfer support,
  (2) a transfer surface layer selected from the group consisting of (i) a second release layer and (ii) a second cushion layer having a release surface with the proviso that the transfer element does not have an adhesive layer which transfers to the colored pattern,
wherein the transfer surface layer is adjacent to a colored pattern in the element from step (C);
(E) removing said carrier support and said carrier surface layer, revealing the adhesive layer;
(F) laminating the element from step (E) to a permanent support, wherein the adhesive layer is adjacent to the permanent support; and
(G) removing said transfer support and said transfer surface layer;
wherein the adhesion force between said carrier support and said carrier surface layer has a value of F1, the adhesion force between said carrier surface layer and said adhesive layer has a value of F2, the adhesion force between said adhesive layer and said first colored pattern layer has a value of F3, the adhesion force between said first colored pattern layer and said transfer surface layer has a value of F4, the adhesion force between said transfer surface layer and said transfer support has a value of F5, and the adhesion force between said adhesive layer and said permanent support has a value of F6; and wherein
each of F1, F3, F4, and F5 is greater than F2, and
each of F3, F5, and F6 is greater than F4; and additionally comprising, in order following step (C):
(C1) laminating to the element from step (C) an additional element, said additional element comprising,
  (1) an additional support,
  (2) an underlying additional photosensitive layer comprising an aqueous liquid developable photosensitive composition,
  (3) an underlying additional adhesive layer;
wherein the additional adhesive layer is adjacent to and overlying the first colored pattern in the element from step (B);
(C2) removing said additional support;
(C3) imagewise exposing to actinic radiation said additional photosensitive layer in register with the previously formed first colored pattern;
(C4) washing out said exposed additional photosensitive layer from step (C3) with an aqueous liquid, thereby removing either the imagewise exposed or imagewise unexposed regions,
(C5) toning the element from step (C4) to produce an additional colored pattern;
(C6) optionally repeating, in order, steps (C1) to (C4) one or more times;
wherein the adhesion force between any of the additional photosensitive layers prior to exposure to actinic radiation and its overlying additional support has a value less than each or F1, F2 and F3 and is less than each of the adhesion forces between adhesive layers and adjacent photosensitive layers or colored patterns;
wherein the adhesion force between said additional adhesive layer and said underlying first colored pattern layer has the value F7, the adhesion force between any of said additional adhesive layers and the underlying additional colored pattern has the value F7$i$, the adhesion force between any of said additional adhesive layers and the overlying additional colored pattern has the value F3$i$, and the adhesion force between the uppermost additional colored pattern layer and said transfer surface layer has a value F4$n$, and wherein
each of F1, F3, F3$i$, F4$n$, F5, F7 and F7$i$ is greater than F2, and
each of F3, F3$i$, F5, F6, F7 and F7$i$ is greater than F4$n$.

3. The process of claim 1 wherein the carrier surface layer is a carrier cushion layer and the photosensitive element further comprises at least one carrier anchor layer between the carrier cushion layer and the carrier support, wherein the adhesion force between the carrier support and the carrier anchor layer, and the adhesion force between the carrier anchor layer and the carrier cushion layer are individually greater than F2 and F7.

4. The process of claim 1 wherein the transfer surface layer is a transfer cushion layer and the transfer element further comprises a transfer anchor layer between the transfer cushion layer and the transfer support, wherein the adhesion force between the transfer support and the transfer anchor layer, and the adhesion force between the transfer anchor layer and the transfer cushion layer are individually greater than F2, F4, and F4'.

5. The process of claim 1 wherein the carrier cushion layer comprises a compound selected from the group consisting of ethylene/vinyl acetate copolymers, ethylene homopolymers, propylene homopolymers, ethylene/propylene copolymers, ethylene/methacrylate copolymers, ethylene/methacrylic acid/isobutylacrylic acid ionomers, ethylene/methacrylic acid copolymers, ethylene/methacrylic acid ionomer, ethylene/acrylic acid copolymers, ethylene/acrylic acid ionomer, and mixtures thereof.

6. The process of claim 4 wherein the transfer cushion layer comprises a compound selected from the group consisting of ethylene/vinyl acetate copolymers, ethylene homopolymers, propylene homopolymers, ethylene/propylene copolymers, ethylene/methacrylate copolymers, ethylene/methacrylic acid/isobutylacrylic acid ionomers, ethylene/methacrylic acid copolymers, ethylene/methacrylic acid ionomers, ethylene/acrylic acid copolymers, ethylene/acrylic acid ionomer, and mixtures thereof.

7. The process of claim 1 wherein the carrier surface layer is a carrier cushion layer comprising a compound selected from the group consisting of ethylene/methacrylic acid copolymers, ethylene/methacrylic acid ionomers, ethylene/acrylic acid copolymers, ethylene/acrylic acid ionomers, and mixtures thereof and the transfer surface layer is a transfer cushion layer comprising an ethylene/vinyl acetate copolymer.

8. The process of claim 1 wherein the photosensitive composition comprises a material selected from the group consisting of N-alkyl styrylpyridinium derivatives of polyvinyl alcohol, N-alkyl styrylquinolinium derivatives of polyvinyl alcohol, and mixtures thereof.

9. The process of claim 1 wherein the adhesive layer comprises a material selected from the group consisting of vinyl chloride/vinylacetate copolymers, ethylene/vinylacetate copolymers, and mixtures thereof.

10. The process of claim 1 wherein the aqueous liquid is water.

* * * * *